(12) United States Patent
Nakamura et al.

(10) Patent No.: US 7,795,732 B2
(45) Date of Patent: Sep. 14, 2010

(54) CERAMIC WIRING BOARD AND PROCESS FOR PRODUCING THE SAME, AND SEMICONDUCTOR DEVICE USING THE SAME

(75) Inventors: Miho Nakamura, Yokohama (JP); Yoshiyuki Fukuda, Ayase (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 457 days.

(21) Appl. No.: 11/815,722

(22) PCT Filed: Jan. 30, 2006

(86) PCT No.: PCT/JP2006/301415

§ 371 (c)(1),
(2), (4) Date: Aug. 7, 2007

(87) PCT Pub. No.: WO2006/082770

PCT Pub. Date: Aug. 10, 2006

(65) Prior Publication Data
US 2009/0050920 A1   Feb. 26, 2009

(30) Foreign Application Priority Data
Feb. 7, 2005   (JP)   ............................. 2005-030092

(51) Int. Cl.
*H01L 23/04*   (2006.01)
*H01L 23/48*   (2006.01)

(52) U.S. Cl. ........................ 257/750; 257/767; 257/703; 257/E23.02

(58) Field of Classification Search ................. 257/701, 257/703, E23.009, 750, 767, E23.02
See application file for complete search history.

(56) References Cited

U.S. PATENT DOCUMENTS

| | | | |
|---|---|---|---|
| 5,198,964 A * | 3/1993 | Ito et al. ...................... | 361/717 |
| 5,367,195 A * | 11/1994 | DiGiacomo et al. ......... | 257/767 |
| 6,590,913 B1 * | 7/2003 | Caras et al. .................... | 372/36 |
| 6,784,543 B2 * | 8/2004 | Matsuki et al. ............. | 257/746 |
| 7,015,583 B2 | 3/2006 | Ishii et al. | |
| 2005/0067636 A1 * | 3/2005 | Amoh et al. ................. | 257/232 |
| 2005/0167679 A1 | 8/2005 | Ishii et al. | |

FOREIGN PATENT DOCUMENTS

| | | |
|---|---|---|
| EP | 1 564 803 A1 | 8/2005 |
| JP | 6-326210 A | 11/1994 |
| JP | 2000-288770 A | 10/2000 |
| JP | 2002-252316 A | 9/2002 |
| JP | 2002-368020 A | 12/2002 |

* cited by examiner

*Primary Examiner*—Nitin Parekh
(74) *Attorney, Agent, or Firm*—Foley & Lardner LLP

(57) ABSTRACT

A ceramic wiring board 10 includes a ceramic substrate 11 and a wiring layer 12 formed on the ceramic substrate 11. The wiring layer 12 includes a wiring part 13 and a connection part 14, the wiring part 13 having a base metal layer 15, a first diffusion preventive layer 16 and a first Au layer 17 which are stacked in sequence on a surface of the ceramic substrate 11, and the connection part 14 having a second diffusion preventive layer 19, a void suppression layer 20 and a solder layer 18 which are stacked in sequence at a desired position on the wiring part 13. The void suppression layer 20 is made of, for example, Au or an Au—Sn alloy containing 85 mass % or more of Au.

12 Claims, 2 Drawing Sheets

CERAMIC WIRING BOARD AND PROCESS FOR PRODUCING THE SAME, AND SEMICONDUCTOR DEVICE USING THE SAME

TECHNICAL FIELD

The present invention relates to a ceramic wiring board used as a mounting board or the like for a semiconductor element, a method of manufacturing the same, and a semiconductor device including the same.

BACKGROUND ART

Insulative ceramic substrates such as an aluminum nitride substrate and a silicon nitride substrate are used as mounting boards for various kinds of semiconductor elements represented by optical semiconductor elements such as a laser diode and a photodiode. When a ceramic substrate is applied to a sub-mounting board for an optical semiconductor element, a wiring layer is formed on a surface of the ceramic substrate by using a thin film forming technique such as a PVD method such as a vacuum deposition method or a sputtering method, or a CVD method (see, for example, Patent Reference 1).

FIG. 4 is a cross-sectional view showing the structure of a conventional ceramic wiring board. In this drawing, 1 denotes an insulative ceramic substrate made of, for example, an aluminum nitride sintered compact, and on its surface, a main conductor layer 4 made of Au is formed via a base metal layer 2 made of Ti and a first diffusion preventive layer 3 made of Pt. On the main conductor layer 4, at a connection part (electrode connection part) with a semiconductor element, a solder layer 6 made of an Au—Sn alloy is formed via a second diffusion preventive layer 5 made of Pt or the like. A surface of the solder layer 6 is sometimes covered by an Au layer 7 for oxidation prevention.

In the ceramic wiring board shown in FIG. 4, a conductor layer in which a base metal layer 2, a first diffusion preventive layer 3, and an Au layer (main conductor layer) 4 are stacked in this order is formed also on a lower surface side of the insulative ceramic substrate 1. The conductor layer on the lower surface side is used as a bonding metal layer when the insulative ceramic substrate 1 is mounted on an external circuit board or in a package. The conductor layer on the lower surface side is sometimes used as a grounding conductor layer or the like.

The aforesaid second diffusion preventive layer 5 interposed between the main conductor layer 4 and the solder layer 6 prevents Au of the main conductor layer 4 from diffusing into the solder layer 6 made of the Au—Sn alloy or the like when the semiconductor element is bonded and fixed via the Au—Sn alloy or the like of the solder layer 6. If Au of the main conductor layer 4 diffuses into the Au—Sn solder alloy, the alloy comes to have an Au-rich composition and increases in melting point, so that the Au—Sn alloy cannot be melted completely at a soldering temperature (heating temperature). This results in a decrease in bonding strength and the like.

However, in the conventional ceramic wiring board, when the wiring board is heated in order to bond the semiconductor element, the bonding strength is sometimes decreased due to poor wettability between Sn in the solder layer 6 and Pt forming the second diffusion preventive layer 5. It has been further found out that Sn in the solder layer 6, when heated, diffuses into the second diffusion preventive layer 5, which causes the formation of voids near an interface between the solder layer 6 and the second diffusion preventive layer 5. The formation of such voids, if any, makes it difficult to firmly bond the wiring board and the semiconductor element. In addition, the voids increase electrical resistance of the connection part, which may possibly increase an operating current of the semiconductor element.

In particular, to mound an optical semiconductor element such as a laser diode on the wiring board, an Au—Sn alloy is mainly used as described above. Since the Au—Sn alloy is hard and fragile, a thermal load or the like at the time of bonding may possibly cause characteristic deterioration of the semiconductor element. To avoid such problems, the use of a Sn alloy such as a Sn—Cu alloy or a Sn—Ag alloy softer than the Au—Sn alloy has been considered. However, generally having a higher Sn concentration than the Au—Sn alloy, these Sn alloys easily react with the diffusion preventive layer (Sn diffuses into the diffusion preventive layer), resulting in easy formation of voids near the interface.

Patent Reference 1: JP-A 2002-252316 (KOKAI)

DISCLOSURE OF THE INVENTION

It is an object of the present invention to provide a ceramic wiring board in which the formation of voids due to the reaction between a solder layer and a diffusion preventive layer is suppressed when a semiconductor element is bonded onto the ceramic wiring board via the solder layer, thereby making it possible to prevent a decrease in bonding strength of the semiconductor element, and further to provide a method of manufacturing the same, and a semiconductor device including such a ceramic wiring board.

A ceramic wiring board according to an aspect of the present invention includes: a ceramic substrate; and a wiring layer including a wiring part and a connection part formed on the wiring part, the wiring part having a base metal layer, a first diffusion preventive layer and a first Au layer which are stacked in sequence on a surface of the ceramic substrate, and the connection part having a second diffusion preventive layer, a void suppression layer and a solder layer containing at least Sn which are stacked in sequence.

A method of manufacturing a ceramic wiring board according to another aspect of the present invention includes: forming a wiring part in a wiring layer by stacking a base metal layer, a first diffusion preventive layer and a first Au layer in sequence on a surface of a ceramic substrate; and forming a connection part in the wiring layer by stacking a second diffusion preventive layer, a void suppression layer and a solder layer containing at least Sn in sequence on the wiring part.

A semiconductor device according to still another aspect of the present invention includes: the ceramic wiring board according to the aspect of the present invention; and a semiconductor element electrically and mechanically connected onto the wiring layer of the ceramic wiring board via the solder layer.

EXPLANATION OF CODES

10 ... ceramic wiring board, 11 ... ceramic substrate, 12 ... wiring layer, 13 ... wiring part, 14 ... connection part, 15 ... base metal layer, 16 ... first diffusion preventive layer, 17 ... first Au layer, 18 ... solder layer, 19 ... second diffusion preventive layer, 20 ... void suppression layer, 30 ... laser diode, 31, 32 ... light emitting part, 34, 35 ... individual electrode, 36 ... common electrode

MODE FOR CARRYING OUT THE INVENTION

Hereinafter, embodiments for carrying out the present invention will be described with reference to the drawings. Through the present invention will be described below based on the drawings, it should be noted that these drawings are provided only for an illustrative purpose and are not intended to limit the present invention.

Figure 1:
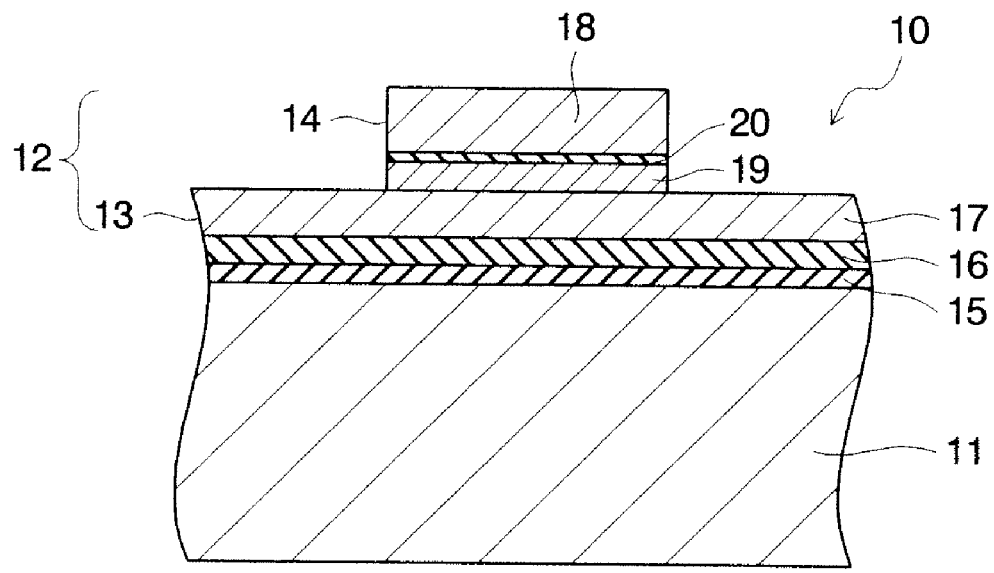
FIG. 1 is a cross-sectional view showing the structure of a ceramic wiring board according to an embodiment of the present invention.

FIG. 1 is a cross-sectional view showing the structure of a ceramic wiring board according to an embodiment of the present invention. A ceramic wiring board 10 shown in FIG. 1 has a ceramic substrate 11 as an insulative substrate. As the ceramic substrate 11, used is, for example, a nitride ceramic (sintered compact) mainly made of aluminum nitride (AlN), silicon nitride ($Si_3N_4$), or the like, or an oxide ceramic (sintered compact) mainly made of aluminum oxide ($Al_2O_3$) or the like. Among them, a nitride ceramic is preferably used because of its excellent heat conductivity and the like. Further, in view of thermal conductivity, silicon carbide (SiC) is also suitable for the substrate. However, when silicon carbide is used as the substrate 11, an insulation film is formed on a surface of the substrate 11 since silicon carbide has conductivity.

On a main surface 11a of the ceramic substrate 11, a wiring layer 12 is formed. The wiring layer 12 is formed by a thin film forming method: for example, a PVD method such as a vacuum deposition method, a sputtering method, an ion plating method, a molecular beam epitaxy (MBE) method, a laser deposition method, or an ion beam deposition method; a CVD method such as a thermal CVD method, a plasma CVD method, or an optical CVD method; or a plating method. The wiring layer 12 has a wiring part 13 and a connection part 14. The wiring part 13 has a base metal layer 15, a first diffusion preventive layer 16, a first Au layer 17 as a main conductor layer which are stacked in this order on the ceramic substrate 11.

The base metal layer 15 contributes to improvement in adhesiveness, adhesion strength, and so on of the ceramic substrate 11 and the wiring layer 12. As the base metal layer 15, used is, for example, at least one kind selected from Ti, Zr, Hf, Nb, Cr, Ta, and Ni, or an alloy based on any of these. Among them, active metal such as Ti, Zr, Hf, or Nb is preferably used in a case where a nitride ceramic is used as the ceramic substrate 11. The thickness of the base metal layer 15 is not specifically limited, but preferably falls within a range from 0.1 to 0.4 μm, for instance.

The first diffusion preventive layer 16 prevents the diffusion of elements to/from the ceramic substrate 11 and the base metal layer 15 from/to the first Au layer 17. As the first diffusion preventive layer 16, used is, for example, at least one kind selected from Pt, Pd, and Ni or an alloy based on any of these. The material of the first diffusion preventive layer 16 is appropriately selected depending on the composing element or the like of the base metal layer 15. If Ni is used as the base metal layer 15, an element except Ni is used. The thickness of the first diffusion preventive layer 16 preferably falls within a range from 0.1 to 0.4 μm, for instance.

The first Au layer 17 functions as a main conductor layer of the wiring part 13. The thickness of the first Au layer 17 preferably falls within a range from 0.1 to 0.3 μm, for instance. The first Au layer 17 whose thickness is less than 0.1 μm might have a poorer function as the main conductor layer. Even the first Au layer 17 whose thickness exceeds 0.3 μm cannot provide a higher effect and in addition, will be a cause of increasing manufacturing cost. The wiring part 13 has a wiring pattern according to, for example, a desired circuit shape.

On the wiring part 13, the connection part 14 having a solder layer 18 is provided at a position where the semiconductor element is to be connected. The connection part 14 with a desired shape is provided at a position corresponding to an electrode of the semiconductor element which is to be bonded and mounted on the ceramic wiring board 10, and has a function of electrically and mechanically connecting the wiring part 13 and the semiconductor element. The connection part 14 has a shape corresponding to the electrode of the semiconductor element, for example, a rectangular shape, a circular shape, or the like, and its size also corresponds to the size of the electrode. Such a connection part 14 has a second diffusion preventive layer 19, a void suppression layer 20, and the solder layer 18 which are stacked in this order at a desired position on the wiring part 13.

The solder layer 18 is made of a solder material containing at least Sn. As such a solder layer 18, used is a simple substance of Sn, or a Sn alloy containing at least one kind selected from Au, Ag, Al, Bi, Cu, Cr, Ga, Ge, Ni, Pt, Si, Ti, and Zn. Among them, a Sn alloy is preferably used to form the solder layer 18. A Sn amount in the Sn alloy is appropriately selected according to the kind of an element used in combination and the like, and preferably falls within a range from 15 to 99.9 mass %, for instance. Typical examples of such a Sn alloy (solder alloy) include an Au—Sn alloy, an Ag—Sn alloy, a Cu—Sn alloy, and so on.

The thickness of the solder layer 18 preferably falls within a range from 1 to 5 μm, for instance. The solder layer 18 having a less than 1 μm thickness reacts with an Au film provided on the electrode of the semiconductor element (the solder layer and the Au film are mixed) when bonded to the semiconductor element, which easily causes the occurrence of compositional deviation. As a result of the compositional deviation, a bonding layer is hardened to cause a stress, which will be a factor of causing a defect such as a crack in the semiconductor element (for example, a laser diode). On the other hand, even the thickness exceeding 5 μm cannot produce a higher bonding effect, and in addition, will be a cause of increasing manufacturing cost.

The solder layer 18 is not limited to the one made of one kind of Sn alloy, and may be formed by a film stack of two kinds of Sn alloys or more different in composition, for instance. In this case, the used Sn alloys are not limited to Sn alloys of two kinds or more having different composing elements, but may be Sn alloys of two kinds or more with the same composing element but with different composition ratios. For example, by forming the solder layer 18 by Au—Sn alloys of two kinds or more different in composition ratio, that is, by a film stack of Au—Sn alloys different in melting temperature, it is possible to control a melting state of the solder layer 18.

The second diffusion preventive layer 19 prevents the diffusion of elements between the first Au layer 17 as the main conductor layer and the solder layer 18 made of, for example, a Sn alloy. In particular, it prevents the alloy composition of the solder layer 18 from becoming Au-rich due to the diffusion of Au of the main conductor layer into the solder layer 18 made of a Sn alloy or the like. The second diffusion preventive layer 19, similarly to the first diffusion preventive layer 16, is preferably made of at least one kind selected from Pt, Pd, and Ni or an alloy based on any of these.

The thickness of the second diffusion preventive layer 19 preferably falls within a range from 0.05 to 1 µm. The second diffusion preventive layer 19 having a less than 0.05 µm thickness might not sufficiently provide the aforesaid effect of preventing the diffusion of an element. On the other hand, the second diffusion preventive layer 19 whose thickness is set to more than 1 µm cannot provide a higher effect, and on the contrary, will be a cause of increasing manufacturing cost and so on.

The void suppression layer 20 interposed between the second diffusion preventive layer 19 and the solder layer 18 inhibits voids from occurring near the interface due to the reaction between the composing element (Pt, Pd, Ni, or the like) of the second diffusion preventive layer 19 and Sn in the solder layer 18 when the semiconductor element is bonded by heating and melting the solder layer 18. To effectively provide such an effect, the void suppression layer 20 is preferably made of Au or an Au—Sn alloy containing 85 mass % or more of Au.

According to the void suppression layer 20 made of Au, since the reaction of the composing element of the second diffusion preventive layer 19 and Sn in the solder layer 18 is suppressed, the formation of voids near the interface can be suppressed with good reproducibility. An Au-rich Au—Sn alloy containing 85 mass % or more of Au can also provide the same effect as is provided by the Au layer. In the Au—Sn alloy forming the void suppression layer 20, if an Au amount in the alloy is less than 85 mass %, its own Sn may possibly be involved in the reaction to form voids. In other words, setting the Au amount to 85 mass % or more can prevent the reaction of Sn due to which voids may be formed.

The thickness of the aforesaid void suppression layer 20 made of Au or an Au-rich Au—Sn alloy preferably falls within a range from 30 to 500 nm. The void suppression layer 20 having a less than 30 nm thickness cannot completely suppress the diffusion of Sn and may possibly have a lower effect of suppressing the formation of voids. On the other hand, if the void suppression layer 20 made of Au or an Au-rich Au—Sn alloy has a more than 500 nm thickness, Au in the void suppression layer 20 is mixed in the solder layer 18, though depending on the thickness of the solder layer 18, and the compositional deviation of the solder layer 18 may possibly occur. More preferably, the thickness of the void suppression layer 20 falls within a range from 100 to 300 nm.

By thus interposing the void suppression layer 20 made of Au or an Au-rich Au—Sn alloy and having a thickness in a range from 30 to 500 nm between the second diffusion preventive layer 19 and the solder layer 18, it is possible to suppress the formation of voids ascribable to the reaction between the composing element of the second diffusion preventive layer 19 and Sn in the solder layer 18 (the diffusion of Sn) and so on, without causing any increase in melting point or the like ascribable to compositional deviation of the solder layer 18. Accordingly, bonding strength of the semiconductor element and so on can be improved, and a resistance increase of the connection part 14 and a resulting increase in operating current of the semiconductor element can be prevented. These contribute to improvement in reliability and performance characteristic of the semiconductor element.

Figure 2:
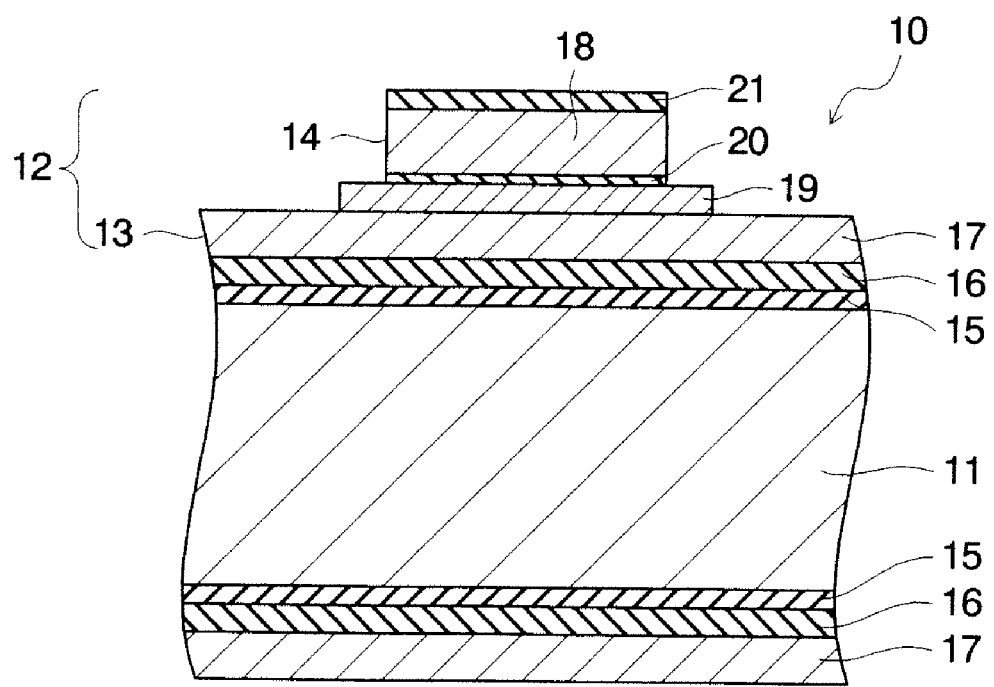
FIG. 2 is a cross-sectional view showing a modification example of the ceramic wiring board shown in FIG. 1.

Here, FIG. 1 shows the structure where the second diffusion preventive layer 19 and the void suppression layer 20 have the same shape as the solder layer 18, but as shown in FIG. 2, the second diffusion preventive layer 19 may have a shape wider than the solder layer 18. That is, the second diffusion layer 19 may have a shape with its outer peripheral portion protruding from an end portion of the solder layer 18. It is preferable that the whole outer peripheral portion of the second diffusion preventive layer 19 protrudes from the end portion of the solder layer 18, but part thereof may protrude from the end portion of the solder layer 18.

According to the second diffusion preventive layer 19 having the above-described shape, the reaction of the solder layer 18 with the first Au layer 17 caused by the wetting and spreading of the solder layer 18 at the time of heating and bonding can be suppressed, and the failure occurrence due to the reaction can be suppressed. That is, when the semiconductor element or the like is bonded, the solder layer 18 melts by heating, resulting in its wetting and spreading. At this time, according to the second diffusion preventive layer 19 wider than the solder layer 18, the wetting and spreading of the solder layer 18 can be suppressed. In other words, an area the solder layer 18 wets and spread over can be limited only to an area on the second diffusion preventive layer 19 low in wettability to a Sn alloy or the like.

By adopting the shape with the outer peripheral portion of the second diffusion preventive layer 19 protruding from the end portion of the solder layer 18, the reaction of the solder layer 18 with the first Au layer 17 due to the wetting and spreading of the solder layer 18 can be suppressed and a compositional change and an increase in melting point of the Sn alloy caused by the reaction can also be suppressed. Accordingly, a melting failure (incomplete melting) and so on due to the increase in melting point of the Sn alloy can be suppressed. Further, since the area the solder layer 18 wets and spreads over can be limited, a height change of the solder layer 18 can be suppressed, which makes it possible to prevent a positional failure or the like in a height direction of the semiconductor element or the like. Preferably, the second diffusion preventive layer 19 has a shape with its outer peripheral portion protruding from the end portion of the solder layer 18 by an amount in a range not less than 1 µm nor more than 100 µm, in order to provide the effect of suppressing an increase in the area the solder layer 18 wets and spreads over.

If the protruding amount of the second diffusion preventive layer 19 from the end portion of the solder layer 18 is less than 1 µm, the solder layer 18 may possibly wet and spread over an area beyond the second diffusion preventive layer 19 when the solder layer 18 melts. Even if the protruding amount exceeds 100 µm, the effect of suppressing the wetting and spreading does not change, but the width of the second diffusion preventive layer 19 is uselessly widened, which may possibly hinder higher density integration of wiring and electrodes. More preferably, the protruding amount of the second diffusion preventive layer 19 is equal to or more than the height of the solder layer 18. Considering formation density of the connection part 14 and so on, the protruding amount of the second diffusion preventive layer 19 is preferably 50 µm or less.

As shown in FIG. 2, the surface of the solder layer 18 may be covered by an Au layer (third Au layer) 21. The Au layer 21 functions as an oxidation preventive layer or the like for the solder layer 18. Further, this embodiment has described the structure where the wiring layer (metal film stack) 12 is formed only on the main surface 11a of the ceramic substrate 11, but as shown in FIG. 2, a base metal layer 15, a first diffusion preventive layer 16, and an Au layer 17 as a main conductor layer may be stacked in this order also on a rear surface 11b side of the ceramic substrate 11. The conductor layer on the rear surface 11b side of the ceramic substrate 11 is used as a bonding metal layer, a grounding conductor layer, and the like when the ceramic substrate 11 is mounted on an external circuit board or in a package.

Figure 3:
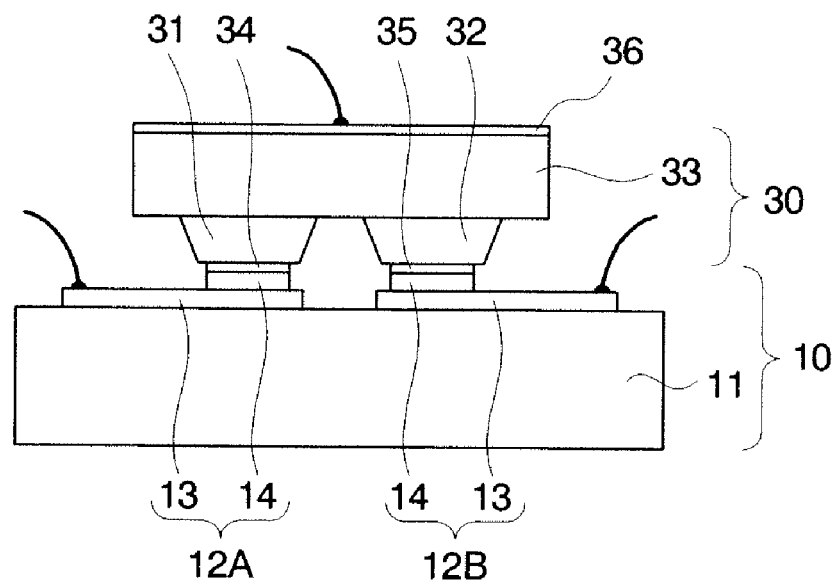
FIG. 3 is a view showing the structure of a semiconductor device according to an embodiment of the present invention.
Figure 4:
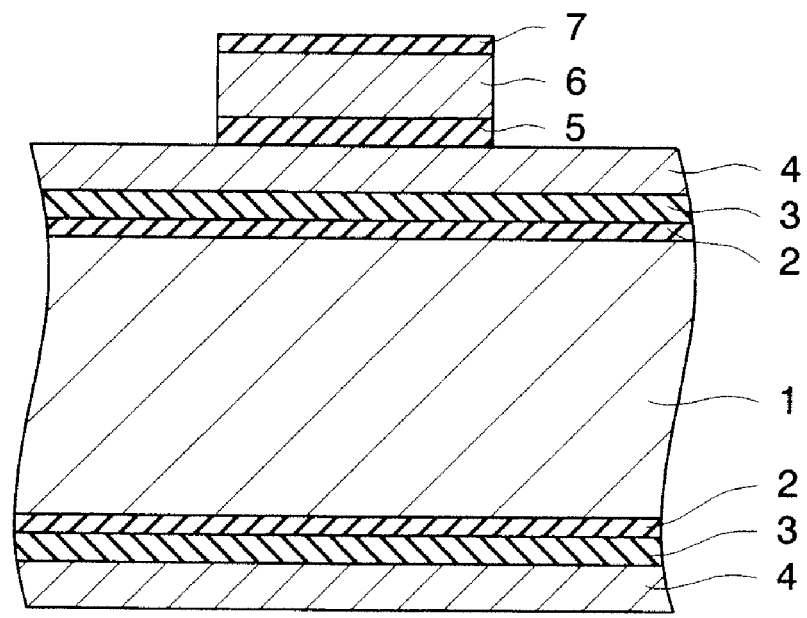
FIG. 4 is a cross-sectional view showing the structure of an essential part of a conventional ceramic wiring board.

Next, a semiconductor device according to an embodiment of the present invention will be described with reference to FIG. 3. FIG. 3 shows the structure of a laser device to which the semiconductor device of the present invention is applied. In FIG. 3, 30 denotes a 2-wavelength laser diode. The 2-wavelength laser diode 30 has, for example, a first light emitting element part 31 with a 650 nm emission wavelength and a second light emitting element part 32 with a 780 nm emission wavelength. These light emitting element parts 31, 32 are formed from a semiconductor layer that is crystal-grown on a GaAs substrate 33. The light emitting element parts 31, 32 have individual electrodes 34, 35 respectively. A common electrode 36 is formed on a rear surface of the GaAs substrate 33.

Such a 2-wavelength laser diode 30 is mounted on the ceramic wiring board 10 of the above-described embodiment. The ceramic wiring board 10 includes a first wiring layer 12A and a second wiring layer 12B each of which has the wiring part 13 and the connection part 14. The electrode 34 of the first light emitting part 31 is bonded to the connection part 14 of the first wiring layer 12A. The electrode 35 of the second light emitting element part 32 is bonded to the connection part 14 of the second wiring layer 12B. The 2-wavelength laser diode 30 is electrically and mechanically connected to the first and second wiring layers 12A, 12B of the ceramic wiring board 10 via the connection parts 14. These components constitute the laser device to which the semiconductor device of the present invention is applied.

In the laser device of the above-described embodiment, the formation of voids due to the reaction between the solder layers 18 and the second diffusion preventive layers 19 included in the connection parts 14 is suppressed when the laser diode 30 is bonded to and mounted on the ceramic wiring board 10. Therefore, it is possible to firmly bond the laser diode 30 to the ceramic wiring board 10 and to prevent a resistance increase of the connection parts 14 and a resulting increase in operating current of the laser diode 30. That is, it is possible to provide a high-quality, high-reliability laser diode 30 with good reproducibility.

Though FIG. 3 shows the embodiment where the laser diode is used as a semiconductor element bonded to and mounted on the ceramic wiring board, it should be noted that the semiconductor device of the present invention is not limited to this. The semiconductor device of the present invention is applicable to any semiconductor device in which any of various semiconductor elements is mounted on the ceramic wiring board, and is especially effective as a semiconductor device in which an optical semiconductor element such as a laser diode or a photodiode is mounted.

Next, concrete examples of the present invention and evaluation results thereof will be described.

EXAMPLES 1 TO 7

First, as the ceramic substrate 11, substrates each made of an aluminum nitride sintered compact with 75 mm diameter× 0.2 mm height were prepared. After the aluminum nitride substrates 11 were cleaned, a base metal layer 15 made of a Ti film with a 0.1 μm thickness, a first diffusion preventive layer 16 made of a Pt film with a 0.2 μm thickness, and a first Au layer 17 as a main conductor layer with a 0.5 μm thickness were stacked in this order on a surface of each of the aluminum nitride substrates 11 by a sputtering method.

Next, on each of the first Au layers 17 as the main conductor layers, a resist having a 1 mm×0.5 mm rectangular opening portion was formed, and thereafter, a second diffusion preventive layer 19 and a void suppression layer 20 were stacked in this order by a sputtering method. Composing materials and thickness of these layers 19, 20 are shown in Table 1. Subsequently, on an upper surface of each of the void suppression layers 20, a solder layer 18 made of a Sn alloy with the composition of 70 mass % Au-30 mass % Sn and having a 2 μm thickness was formed by a vacuum deposition method. Each sample was subjected to later-described characteristic evaluation after being diced into 2 mm×2 mm.

EXAMPLES 8 TO 11

Samples were fabricated in the same manner as in the above-described examples 1 to 7 except in that the composing material of each of the second diffusion preventive layers 19 was changed, and were subjected to the later-described characteristic evaluation. The composing materials of the second diffusion preventive layers 19 in the examples 8 to 11 are shown in Table 1.

EXAMPLES 12 TO 16

Samples were fabricated in the same manner as in the above-described example 1 to 7 except in that the composition of each of the solder layers 18 was changed, and were subjected to the later-described characteristic evaluation. The compositions of the solder layers 18 in the examples 12 to 16 are shown in Table 1

EXAMPLES 17 TO 20

Samples were fabricated in the same manner as in the above-described examples 1 to 7 except in that the composing material and thickness of each of the void suppression layers 20 were changed, and were subjected to the later-described characteristic evaluation. The composing materials and thickness of the void suppression layers 20 in the examples 17 to 20 are shown in Table 1.

COMPARATIVE EXAMPLES 1 TO 3

Samples were fabricated in the same manner as in the above-described examples 1 to 7 except in that the void suppression layer 20 was not formed, and were subjected to the later-described characteristic evaluation. The comparative example 1 is an example where an alloy with the composition of 70 mass % Au-30 mass % Sn was used as the solder layer 18. The comparative example 2 is an example where an alloy with the composition of 82 mass % Au-18 mass % Sn was used as the solder layer 18. The comparative example 3 is an example where an alloy with the composition of 95 mass % Sn-5 mass % Ag was used as the solder layer 18.

TABLE 1

| | second diffusion preventive layer | | void suppression layer | | solder layer composition |
|---|---|---|---|---|---|
| | material | thickness (μm) | material (mass %) | thickness (nm) | (mass %) |
| Ex.1 | Pt | 0.2 | Au | 30 | 70Au—30Sn |
| Ex.2 | Pt | 0.2 | Au | 100 | 70Au—30Sn |
| Ex.3 | Pt | 0.2 | Au | 500 | 70Au—30Sn |
| Ex.4 | Pt | 0.05 | Au | 100 | 70Au—30Sn |
| Ex.5 | Pt | 0.5 | Au | 100 | 70Au—30Sn |
| Ex.6 | Pt | 1.0 | Au | 100 | 70Au—30Sn |
| Ex.7 | Pt | 0.2 | Au | 10 | 70Au—30Sn |
| Ex.8 | Ni | 0.2 | Au | 100 | 70Au—30Sn |
| Ex.9 | Pd | 0.2 | Au | 100 | 70Au—30Sn |
| Ex.10 | Pt—Sn | 0.2 | Au | 100 | 70Au—30Sn |
| Ex.11 | Pt—Au | 0.2 | Au | 100 | 70Au—30Sn |
| Ex.12 | Pt | 0.2 | Au | 100 | 65Au—35Sn |
| Ex.13 | Pt | 0.2 | Au | 100 | 100Sn |
| Ex.14 | Pt | 0.2 | Au | 100 | 99.3Sn—0.7Cu |
| Ex.15 | Pt | 0.2 | Au | 100 | 96.5Sn—3.5Ag |
| Ex.16 | Pt | 0.2 | Au | 100 | 96.5Sn—3Ag—0.5Bi |
| Ex.17 | Pt | 0.2 | 85Au—15Sn | 30 | 70Au—30Sn |
| Ex.18 | Pt | 0.2 | 90Au—10Sn | 30 | 70Au—30Sn |
| Ex.19 | Pt | 0.2 | 95Au—5Sn | 100 | 70Au—30Sn |
| Ex.20 | Pt | 0.2 | 95Au—5Sn | 100 | 96.5Sn—3.5Cu |
| C.Ex.1 | Pt | 0.2 | not provided | — | 70Au—30Sn |
| C.Ex.2 | Pt | 0.2 | not provided | — | 82Au—18Sn |
| C.Ex.3 | Pt | 0.2 | not provided | — | 95Sn—5Ag |

Ex. = Example,
C.Ex. = Comparative Example

Regarding ceramic wiring boards (the samples whose structures are shown in Table 1) of the above-described examples 1 to 20 and comparative examples 1 to 3, the presence/absence of voids in the connection part and adhesiveness to a semiconductor element were measured and evaluated in the following manner. Table 2 shows evaluation results of the respective examples.

[Presence/Absence of Voids in the Connection Part]

As for the examples having the Au—Sn solder alloy layer, each of the wiring boards was placed on a heater block kept at a temperature of about 330 to 350° C., and after about 5 seconds, a Si chip was mounted on and bonded to each of the wiring boards. As for the examples having the Ag—Sn solder alloy layer, each of the samples was heated to a temperature of about 250 to 260° C., and as for the examples having the Cu—Sn solder alloy layer, each of the samples was heated to a temperature of about 240 to 260° C., and then a Si chip was bonded to each. The Si chip was composed of a Ti film with a 0.05 μm thickness, a Pt film with a 0.1 μm thickness, and an Au film with a 1.0 μm thickness which were deposited in this order on a surface bonded to the wiring board, and had a shape of 0.9 mm×0.3 mm×0.4 mm height. In each of the examples, the mount of the Si chip was carried out on four wiring boards.

After the wiring boards each thus having the Si chip mounted thereon were cooled, the Si chips and the wiring boards were cut perpendicularly to the bonding surfaces, followed by polishing, and the presence/absence of voids in each bonding layer was evaluated by electron microscope observation in a cross-sectional direction. In the determination of the presence/absence of voids in the bonding layer, N represents that no void was observed in all the observed samples, M represents that voids were observed in a ⅓ length or less of the cross section in one sample or more among the four observed samples, X represents that voids were observed in a ⅓ length or more of the cross section in one sample or more, and XX represents that voids exist in the cross section of all the four observed samples.

[Adhesiveness to the Semiconductor Element]

In the similar manner to that of the above-described evaluation of the presence/absence of voids, after a Si chip was mounted on each of the wiring boards in the examples, a shear test of applying a load from a horizontal direction of the Si chip was conducted. The shear test was conducted on six samples in each of the examples. In the shear test, when adhesiveness is good, a breaking mode in the Si chip is shown. At this time, since breaking strength of Si depends on material strength, values of shear strength greatly vary. Therefore, in determining adhesiveness, when the Si breaking mode is exhibited at a value equal to or more than a certain strength (in the case of the aforesaid size, 1200 kgf), adhesiveness is determined as good, and N represents that all the samples exhibit good adhesiveness, M represents that 3 to 5 samples exhibit good adhesiveness, and X represents that two or less samples exhibit good adhesiveness. Table 2 shows evaluation results together with average values of the share strength.

TABLE 2

| | | adhesiveness to semiconductor element | |
|---|---|---|---|
| | presence/absence of voids in bonding layer | adhesiveness evaluation | shear strength (Kgf) |
| Ex.1 | N | N | 1767 |
| Ex.2 | N | N | 1986 |
| Ex.3 | N | N | 2234 |
| Ex.4 | N | N | 1873 |
| Ex.5 | N | N | 2158 |
| Ex.6 | N | N | 1697 |
| Ex.7 | M | M | 659 |
| Ex.8 | N | N | 2286 |
| Ex.9 | N | N | 2041 |
| Ex.10 | N | N | 1971 |
| Ex.11 | N | N | 1865 |

TABLE 2-continued

|  | adhesiveness to semiconductor element | | |
|---|---|---|---|
|  | presence/absence of voids in bonding layer | adhesiveness evaluation | shear strength (Kgf) |
| Ex.12 | N | N | 2207 |
| Ex.13 | N | N | 1677 |
| Ex.14 | N | N | 2103 |
| Ex.15 | N | N | 1584 |
| Ex.16 | N | N | 1428 |
| Ex.17 | N | N | 2123 |
| Ex.18 | N | N | 1733 |
| Ex.19 | N | N | 2324 |
| Ex.20 | N | N | 2104 |
| C.Ex.1 | XX | X | 242 |
| C.Ex.2 | X | M | 821 |
| C.Ex.3 | X | X | 178 |

Ex. = Example,
C.Ex. = Comparative Example

As is apparent from Table 2, when the wiring boards of the examples are used, voids are not observed in the bonding layer, and as a result, good adhesiveness to the semiconductor element is obtained. Incidentally, in the example 7, because the thickness of the void suppression layer is 10 nm, a few voids were observed in the bonding layer. From the results of the examples including the example 7, the thickness of the void suppression layer preferably falls within a range from 30 to 500 nm. On the other hand, in all the comparative examples 1 to 3 where no void suppression layer is used, voids are formed, and as a result, adhesiveness to the semiconductor element is inferior.

EXAMPLES 21, 22

In the same manner as in the above-described examples, a base metal layer 15 made of a Ti film with a 0.1 μm thickness, a first diffusion preventive layer 16 made of a Pt film with a 0.2 μm thickness, and a first Au layer 17 as a main conductor layer with a 0.5 μm thickness were stacked in this order on each aluminum nitride substrate 11. Next, on each of the first Au layers 17 as the main conductor layers, a second diffusion preventive layer 19 made of a Pt film with a 0.1 μm thickness, a void suppression layer 20 made of an Au film with a 100 nm thickness, and a solder layer 18 made of a Sn alloy film with the composition of 65 mass % Au-35 mass % Sn and with a 2 μm thickness were formed in this order by a vacuum deposition method.

At this time, the second diffusion preventive layer 19 was formed to have a shape protruding from an end portion of the solder layer 18 by a predetermined length. A protruding amount of the second diffusion preventive layer 19 from the solder layer 18 was 10 μm in the example 21 and 50 μm in the example 2. Each of such samples was diced into 2 mm×2 mm, and thereafter, characteristics thereof were measured and evaluated in the same manner as in the above-described examples. Further, the time for complete melting of the solder layer and the state of wetting and spreading thereof were measured and evaluated in the following manner. Table 3 shows evaluation results of the respective examples. The solder layer of the above-described comparative example 1 was also evaluated.

[Time for Complete Melting of the Solder Layer]

In the same manner as that of the above-described void presence/absence evaluation, the wiring board of each of the examples was placed on a heater block, and while inert gas was sprayed so as to prevent the formation of an oxide film on the surface, a change in surface glossiness of the solder layer was observed for about 60 seconds, and meltability (wettability) of the solder layer was evaluated. This utilizes a phenomenon that, when a melting point of the solder layer becomes higher than the kept temperature, a high-melting point phase precipitates to weaken surface glossiness. In determining the time for complete melting of the solder layer, it was evaluated based on the time during which surface glossiness was maintained.

[State of Wetting and Spreading of the Solder Layer]

Regarding the samples subjected to the above-described test on the time for complete melting of the solder layer, the state of wetting and spreading of the solder layer was observed by a metallurgical microscope (×100 magnification) and evaluated. In the evaluation, Y represents that the solder layer wets and spreads over an area only on the second diffusion preventive layer, and x represents that the solder layer wets and spreads over an area protruding up to the surface of the first Au layer.

TABLE 3

|  | presence/ absence of voids in bonding layer | state of wetting and spreading of solder layer | time for complete melting of solder layer (sec) | adhesiveness to semiconductor element | |
|---|---|---|---|---|---|
|  |  |  |  | adhesiveness evaluation | shear strength (Kgf) |
| Example 21 | Y | Y | ≧60 | Y | 1892 |
| Example 22 | Y | Y | ≧60 | Y | 2075 |
| Comparative Example 1 | XX | X | 13 | X | 242 |

As is apparent from Table 3, by forming the second diffusion preventive layer 19 in a shape protruding from the end portion of the solder layer 18, the solder layer 18 is prevented from increasing in melting point due to its reaction with the first Au layer. Accordingly, it is possible to improve adhesiveness to the semiconductor element with higher reproducibility.

INDUSTRIAL APPLICABILITY

Since the ceramic wiring board of the present invention has the void suppression layer interposed between the second diffusion preventive layer and the solder layer containing Sn, it is possible to prevent a decrease in bonding strength of a semiconductor element and an increase in operating current thereof ascribable to the formation of voids. Such a ceramic wiring board is useful as a mounting board for a semiconductor element. Further, the use of the ceramic wiring board of the present invention makes it possible to provide a semiconductor device excellent in reliability and operating characteristic with good reproducibility.

What is claimed is:

1. A ceramic wiring board, comprising:
a ceramic substrate; and
a wiring layer including a wiring part and a connection part formed on the wiring part, the wiring part having a base metal layer, made of at least one selected from Ti, Zr, Hf, Nb, Cr, Ta, Ni, a Ti-based alloy, a Ta-based alloy, and a Ni-based alloy, a first diffusion preventive layer made of at least one selected from Pt, Pd, Ni, a Pt-based alloy, a Pd-based alloy, and a Ni-based alloy and a first Au layer which are stacked in sequence on a surface of the ceramic substrate, and the connection part having a second diffusion preventive layer, made of at least one selected from Pt, Pd, Ni, a Pt-based alloy, a Pd-based alloy, and a Ni-based alloy, a void suppression layer made of Au or an Au—Sn alloy containing 85 mass % or more of Au and a solder layer containing at least Sn which are stacked in sequence,
wherein the void suppression layer has a thickness in a range of not less than 30 nm nor more than 500 nm, the first diffusion preventive layer has a thickness in a range of not less than 0.1 μm nor more than 0.4 μm, and the second diffusion preventive layer has a thickness in a range of not less than 0.05 μm nor more than 1 μm.

2. The ceramic wiring board according to claim 1, wherein the solder layer is made of a Sn alloy containing at least one selected from Au, Ag, Al, Bi, Cu, Cr, Ga, Ge, Ni, Pt, Si, Ti, and Zn.

3. The ceramic wiring board according to claim 1, wherein the second diffusion preventive layer has a wider width than the solder layer.

4. The ceramic wiring board according to claim 3, wherein the second diffusion preventive layer has a shape with an outer peripheral portion thereof protruding from an end portion of the solder layer by an amount in a range not less than 1 μm nor more than 100 μm.

5. The ceramic wiring board according to claim 1, wherein the connection part has a third Au layer formed on the solder layer.

6. A semiconductor device, comprising: the ceramic wiring board according to claim 1; and a semiconductor element electrically and mechanically connected onto the wiring layer of the ceramic wiring board via the solder layer.

7. The semiconductor device according to claim 6, wherein the semiconductor element is an optical semiconductor element.

8. The ceramic wiring board according to claim 1, wherein the ceramic substrate comprises an aluminum nitride sintered compact.

9. A system comprising a ceramic wiring board, wherein the ceramic wiring board comprises:
a ceramic substrate; and
a wiring layer including:
a wiring portion; and
a connection portion formed over the wiring portion;
wherein the wiring portion comprises:
a base metal layer comprising at least one of Ti, Zr, Hf, Nb, Cr, Ta, Ni, a Ti-based alloy, a Ta-based alloy, or a Ni-based alloy;
a first diffusion preventive layer comprising at least one of Pt, Pd, Ni, a Pt-based alloy, a Pd-based alloy, or a Ni-based alloy; and
a first Au layer;
wherein the base metal layer, the first diffusion layer, and the first Au layer are stacked in sequence over a surface of the ceramic substrate;
wherein the connection portion comprises:
a second diffusion preventive layer comprising at least one of Pt, Pd, Ni, a Pt-based alloy, a Pd-based alloy, or a Ni-based alloy;
a void suppression layer comprising Au or an Au—Sn alloy containing 85 mass % or more of Au; and
a solder layer comprising Sn;
wherein the second diffusion preventive layer, the void suppression layer, and the solder layer are stacked in sequence; and
wherein the void suppression layer has a thickness between 30 nm and 500 nm, the first diffusion preventive layer has a thickness between 0.1 μm and 0.4 μm, and the second diffusion preventive layer has a thickness between 0.05 μm and 1 μm.

10. The system of claim 9, wherein the ceramic substrate comprises one of an aluminum nitride, a silicon nitride, an aluminum oxide, or a silicon carbide.

11. The system of claim 9, wherein the second diffusion preventive layer has a wider width than the solder layer, and wherein the second diffusion preventive layer has a shape with an outer peripheral portion thereof protruding from an end portion of the solder layer by an amount of between 1 μm and 100 μm.

12. The system of claim 9, further comprising a semiconductor element electrically and mechanically coupled to the wiring layer of the ceramic wiring board via the solder layer.

* * * * *